(12) United States Patent
Miyajima

(10) Patent No.: US 6,224,360 B1
(45) Date of Patent: May 1, 2001

(54) RESIN SEALING DEVICE FOR CHIP-SIZE PACKAGES

(75) Inventor: Fumio Miyajima, Nagano (JP)

(73) Assignee: Apic Yamada Corporation, Nagano (JP)

(*) Notice: Subject to any disclaimer, the term of this patent is extended or adjusted under 35 U.S.C. 154(b) by 0 days.

(21) Appl. No.: 09/313,997

(22) Filed: May 19, 1999

Related U.S. Application Data

(62) Division of application No. 08/898,832, filed on Jul. 23, 1997, now Pat. No. 6,048,483.

(30) Foreign Application Priority Data

Jul. 23, 1996 (JP) .................................................. 8-193471
Jul. 23, 1996 (JP) .................................................. 8-193492

(51) Int. Cl.[7] ............................. B29C 45/14; H01L 21/58
(52) U.S. Cl. .......................... 425/89; 425/116; 425/127; 425/544
(58) Field of Search .......................... 425/89, 116, 405.1, 425/544, 117, 127, 125

(56) References Cited

U.S. PATENT DOCUMENTS

| | | | |
|---|---|---|---|
| H1654 | 6/1997 | Rounds | 264/272.17 |
| 4,347,211 | 8/1982 | Bandoh | 425/544 |
| 4,470,786 | * 9/1984 | Sano et al. | 425/125 |
| 5,098,626 | 3/1992 | Pas | 264/272.17 |
| 5,779,958 | * 7/1998 | Nishihara et al. | 264/272.15 |
| 5,846,477 | * 12/1998 | Hotta et al. | 425/116 |
| 5,891,384 | 4/1999 | Miyajima | 264/511 |

FOREIGN PATENT DOCUMENTS

| | | |
|---|---|---|
| 0 665 584 A1 | 8/1995 | (EP) . |
| 0 747 942 A2 | 12/1996 | (EP) . |
| 8-156014 | * 6/1996 | (JP) . |

OTHER PUBLICATIONS

Semiconductor Packaging Update, 1994 vol. 9, No. 6, Editor & Publisher: Dr. Subash Khadpe.

* cited by examiner

Primary Examiner—Robert Davis
(74) Attorney, Agent, or Firm—Sughrue, Mion, Zinn, Macpeak & Seas, PLLC

(57) ABSTRACT

A resin sealing method for a chip size package electrically connected to electrodes of a semiconductor chip in a chip face of the semiconductor chip with one end of leads joined and the other end thereof exposed to an outer face of a sealing resin for sealing the chip face as connection parts to a package substrate, includes the steps of: providing a first transfer mold formed with a cavity recess in which an object to be molded including the semiconductor chip joined to leads is set, and a second transfer mold mated with the first transfer mold; setting the object to be molded in the cavity recess with a transfer mold face containing the cavity recess of the transfer mold; covering the mold face of the first and second mold with release films having flexibility and heat resistance, respectively; clamping the object to be molded with the transfer mold face of the second mold; and filling the cavity of the first mold with a resin for sealing the package with the resin.

20 Claims, 9 Drawing Sheets

RESIN SEALING DEVICE FOR CHIP-SIZE PACKAGES

This is a divisional of application Ser. No. 08/898,832 filed Jul. 23, 1997, and now U.S. Pat. No. 6,048,483 the disclosure of which is incorporated herein by reference.

BACKGROUND OF THE INVENTION

1. Field of the Invention

This invention relates to a resin sealing method and device for chip size packages.

2. Description of the Related Art

The chip size packages (hereinafer referred to as "CSP") are formed substantially in the same size as a semiconductor chip, and as one of the CSPs, there is an SON (small outline nonlead) package. FIGS. 1 and 2 are a sectional view and a bottom view of the CSP, particularly SON, respectively. In FIG. 1, reference numeral 10 denotes a semiconductor chip; 112 denotes a die pad; and 114 is leads for electrically connecting the semiconductor chip 10 and a package substrate. Each of the leads 114 is formed as a bonding part 114a joined to the semiconductor chip 10 at a center thereof with the surface of a joint electrically connected to an electrode of the semiconductor chip 10 by wire bonding. An outer portion of each of the bonding parts 114a is formed as a connection part 114b slightly floating up from the chip face and extending in parallel with the chip face for connection to the package substrate.

Each of the connection parts 114b is placed in the chip face of the semiconductor chip 10 and the whole package is formed substantially in a chip size. Reference numeral 116 denotes bonding wires for electrically connecting the electrode of the semiconductor chip 10 and each of the leads 114. Reference numeral 18 denotes a sealing resin for sealing the joint faces to the leads 114 of the semiconductor chip 10. The sealing resin 18 seals the wiring bonding portions of the semiconductor chip 10 and the leads 114 and also supports the connection parts 114b, of the leads 114 at predetermined positions.

The connection part 114b of each the respective lead 114 is exposed to the outer face of the sealing resin 18 for connection to the package substrate by soldering, etc. In the example shown in FIGS. 1 and 2, the connection parts 114b are placed in parallel with a given spacing on two opposed sides on the outer face of the sealing resin 18. They are formed on a flat face so that they can be connected to the connection parts of the package substrate by soldering, etc.

If a normal transfer mold method is used to seal the joint faces of the semiconductor chip 10 and the leads 114 with a resin in a manufacturing process of CSPs as described above, resin fins may occur on the surfaces of the leads 114. Thus, because the normal transfer mold method cannot be used and hitherto, a potting method has been used to seal with a resin. Since the CSP has a large number of leads 114 placed in parallel with the chip face, it is placed in portrait orientation and a potting resin is injected.

However, the potting method involves the following problems: It takes much time until the resin hardens, and mass productivity is poor. Air is easily caught in the resin at the potting time, whereby voids easily occur. Close adherence of the resin to the semiconductor chip 10 is not necessarily sufficient. The potting method is lower in resin molding accuracy than the resin sealing method using a transfer mold. Voids occurring in the package cause cracks to occur due to heat at a curing process. After packaging, temperature rise and drop in the external environment act repeatedly on the package, thereby breaking the package or short-circuiting the wiring pattern.

FIGS. 3A to 3D show other product examples of the CSP. For a product shown in FIG. 3A, a wiring pattern 212 is provided via an electric insulating layer 211 on a face where surface electrodes of a semiconductor chip 10 are placed, and solder balls 214 are joined as external connection pins. The solder balls 214 are connected to one end of the wiring pattern 212 and the other end of the wiring pattern 212 is extended like leads from the periphery of the electric insulating layer 211 to the outside and are bonded to the surface electrodes 216 of the semiconductor chip 10.

A sealing resin 18 of the wiring pattern 212 is bonded to the surface electrodes 216. Hitherto, the wiring pattern 212 of the portion bonded to the surface electrodes 216 has been sealed by potting. The reason why it has been sealed by potting is as follows: Since the wiring pattern 212 in the chip size package is supported via the electric insulating layer 211 on the semiconductor chip 10, if the wiring pattern 212 is sealed with a resin by a normal transfer mold method, a molded article (an object to be molded) cannot reliably be pressed and a resin fin occurs in an unnecessary part and when a runner is peeled off or a gate is broken after the wiring pattern 212 is sealed with the resin, the wiring pattern may be damaged.

FIG. 3B shows a structure in which a semiconductor chip 10 is housed in a ring 120 shaped like a rectangular frame and FIG. 3C shows a structure in which a semiconductor chip 1(is housed in a can 222 as other product examples of CSPs. FIG. 3D shows a fan-in/fan-out type product wherein the semiconductor chip 10 is supported on a package substrate 224 formed with a recess for housing the semiconductor chip 10 and a wiring pattern 212 is provided in each of an inner area and an outer area of the semiconductor chip 10 and external connection pins are bonded. For every example shown in FIGS. 3B, 3C and 3D, the wiring pattern 212 of the portion bonded to the surface electrodes 216 of the semiconductor chip 10 is sealed by potting.

SUMMARY OF THE INVENTION

This invention has been made in view of the above circumstances, and therefore an object of the invention is to provide a resin sealing method and device for CSPs which can reliably seal packages with a resin without causing resin fins to occur, enable easy mass production of CSPs, and can provide high-reliability CSPs.

Another object of the invention is to provide a resin sealing method and device for chip size packages for enabling CSPs to be sealed with a resin by a transfer mold method, thereby improving the molding accuracy of the packages and preventing voids from occurring in the package, thereby easily manufacturing high-reliability chip size packages.

To achieve the above objects, according to a first aspect of the invention, there is provided a resin sealing method of a CSP electrically connected to electrodes of a semiconductor chip in the chip face of the semiconductor chip with one end of leads joined and the other end thereof exposed to the outer face of a sealing resin for sealing the chip face as connection parts to a package substrate, etc., the method comprising the steps of using a transfer mold formed with a cavity recess in which the molded article comprising the semiconductor chip joined to the leads is set, setting the molded article in the cavity recess with the transfer mold face containing the cavity recess of the transfer mold covered with a release film having required flexibility and heat; resistance, clamping the molded article with the transfer mold face of the other transfer mold mated with that transfer mold with a release film, and filling the cavity with a resin for sealing the package with the resin.

The plane portion of the cavity recess in which the molded article is housed is varied in size. When the molded article is set in the cavity recess, the plane portion is set larger than the outside dimensions of the semiconductor chip. After the molded article is set in the cavity recess, the size of the plane portion of the cavity recess is reduced matching the outside dimensions of the molded article and the molded article is clamped from the side face for resin sealing.

Of the transfer mold parts making up the four side faces of the cavity recess, the transfer mold part formed with the gate is made a fixed mold part and the remaining transfer mold parts are made moving mold parts for varying the size of the plane portion of the cavity recess.

According to the invention, there is provided a resin sealing system of a CSP electrically connected to electrodes of a semiconductor chip in the chip face of the semiconductor chip with one end of leads joined and the other end thereof exposed to the outer face of a sealing resin for sealing the chip face as connection parts to a package substrate, etc., the system comprising a transfer mold formed with a cavity recess for housing the molded article for clamping the molded article forming the CSP and filling the cavity with a resin and attraction and support means for air-attracting and supporting release films having required flexibility and heat resistance on the transfer mold faces of the upper and lower molds containing the cavity recess of the transfer mold.

The attraction and support means comprises an attraction hole opened to the clamp face of the transfer mold, a cavity attraction hole opened on the inner bottom face of the cavity recess, and an air mechanism communicating with the attraction hole and the cavity attraction hole.

To vary the size of the plane portion of the cavity recess in which the molded article is set, the transfer mold forming the cavity recess is formed with split molds making up the cavity recess and the split molds include moving molds that can be moved by move means.

The moving pin is also provided for pressing the semiconductor chip in the molded article against the inner bottom face of the cavity when the cavity is filled with a resin.

According to a second aspect of the invention, there is provided a resin sealing method of a chip size package comprising a wiring pattern supported via an electric insulating layer on one side of a semiconductor chip and extended like leads from the periphery of the electric insulating layer and connected to surface electrodes of the semiconductor chip, the connection parts being sealed with a resin, said method comprising the steps of using a transfer mold formed with a cavity recess in which the molded article comprising the wiring pattern supported on the semiconductor chip is set, setting the molded article in the cavity recess with the clamp faces containing the cavity recess of the transfer mold covered with release films having required flexibility, heat resistance, and elasticity, clamping the molded article via the release films, and filling the cavity recess with a resin.

The plane portion of the cavity recess in which the molded article is set is varied in size. When the molded article is set in the cavity recess, the plane portion is set larger than the outside dimensions of the molded article. After the molded article is set in the cavity recess, the dimensions of the plane portion of the cavity recess are reduced matching the outside dimensions of the molded article for resin molding.

Of the transfer mold parts making up the four side faces of the cavity recess, the transfer mold parts forming the side faces formed with a gate communicating with the cavity are made fixed mold parts and the transfer mold parts making up the remaining side faces are made moving mold parts.

According to the invention, there is provided a resin sealing system of a chip size package comprising a wiring pattern supported via an electric insulating layer on one side of a semiconductor chip and extended like leads from the periphery of the electric insulating layer and connected to surface electrodes of the semiconductor chip, the connection parts being sealed with a resin, said system comprising a transfer mold formed with a cavity recess for housing the molded article as a transfer mold for clamping the molded article comprising the wiring pattern supported on the semiconductor chip and filling the cavity recess with a resin and attraction and support means for air-attracting and supporting release files having required flexibility, heat resistance, and elasticity on the transfer mold faces containing the cavity recess of the transfer mold.

The attraction and support means comprises an attraction hole opened to the clamp face of the transfer mold, a cavity attraction hole opened on the inner bottom face of the cavity recess, and an air mechanism communicating with the attraction hole and the cavity attraction hole.

The transfer mold forming the cavity recess comprises split molds making up the cavity recess, and the split molds include moving molds that are movable by a moving means.

To vary the dimensions of the plane portion of the housing of the molded article in the cavity recess in which the molded article is set, the transfer mold forming the cavity recess is formed with moving parts and moving means for moving the moving parts is provided.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the invention with reference to the accompanying drawings.

Figure 4:
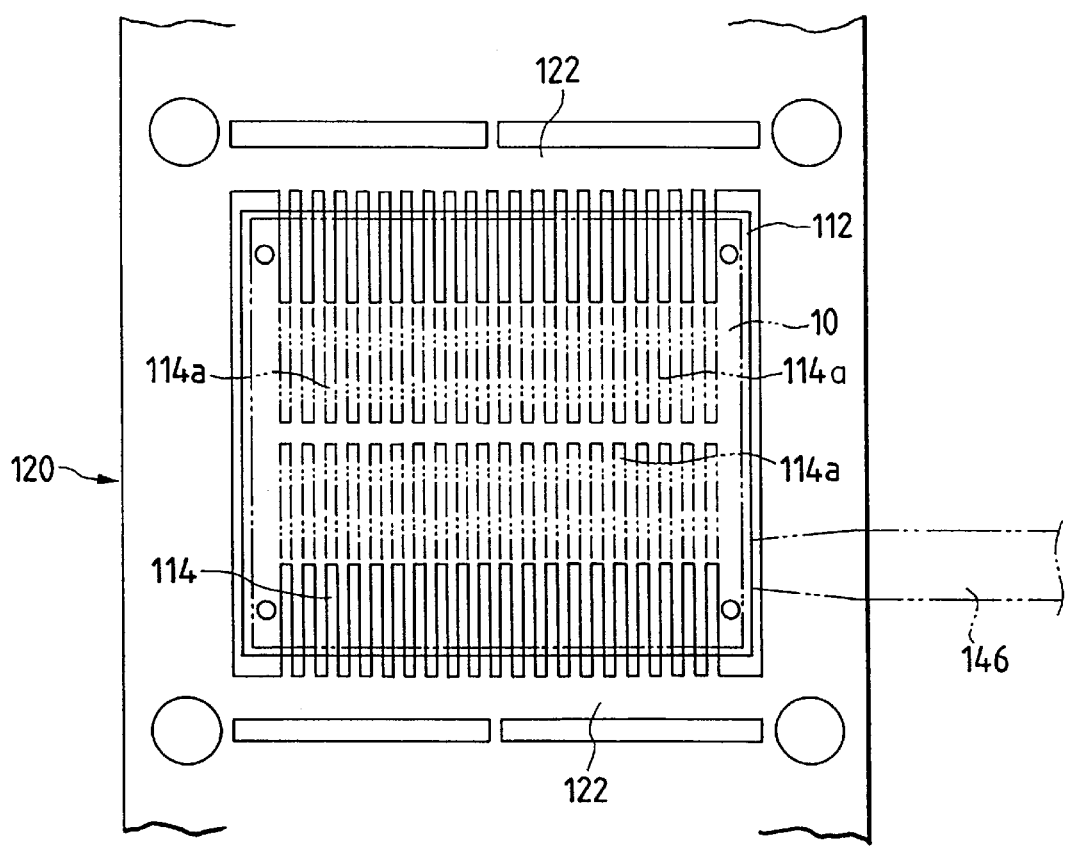
FIG. 4 is a plan view of a lead frame forming a CSP.

FIG. 4 is a plan view of a lead frame 120 of a CSP used for sealing with a resin. It also shows the placement position of a semiconductor chip 10 mounted on the lead frame 120, a die pad 112, a resin sealing range, and a gate position at the resin sealing time. Leads 114 are supported at one end on a support bar 22 located in the width direction of the lead frame 120 and extend at a tip to the center from each of the paired support bars 122.

The semiconductor chip 10 is aligned with bonding parts 114a of the leads 114 and joined to the lower faces of the leads 114, then the bonding parts 114a and electrodes of the semiconductor chip 10 are wire-bonded.

Figure 5:
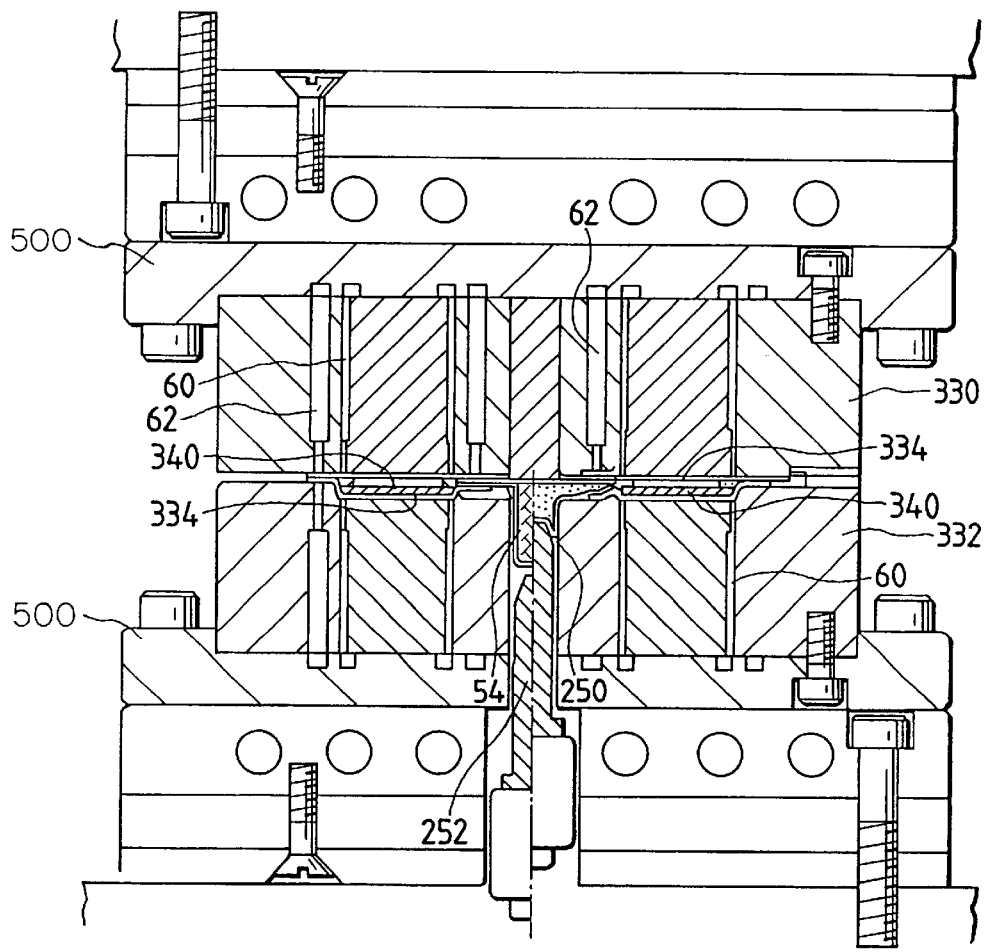
FIG. 5 is a sectional view of a resin sealing system for sealing with a resin the lead frame forming the CSP.

After the wire bonding, the lead frame 120 is sealed with a resin. In the embodiment, a resin sealing method using release films is used to seal with a resin. FIG. 5 is a sectional view to show the structure of the main part of a resin sealing system for sealing with a resin the lead frame 120 on which the semiconductor chip 10 is mounted. Numeral 340 is a molded article (an object to be molded) comprising the semiconductor chip 10 mounted on the lead frame 120.

The resin sealing system of the embodiment is a system for manufacturing CSPs by a transfer mold method and is characterized by the fact that transfer mold faces of an upper mold 330 and EL lower mold 332 for clamping a molded article are covered with a release film 334 for sealing the molded article with a resin.

In FIG. 5, numeral 340 is a molded article sealed with a resin by the transfer mold method. FIG. 5 shows a state in which the molded article 340 is clamped by the upper mold 330 and the lower mold 340 in the left half of the center line and a state in which a cavity is filled with a resin in the right half of the center line. Numeral 250 is a pot for supplying a mold resin and numeral 252 is a plunger. A cavity recess for setting the molded article 340 and sealing with a resin is placed on both sides for sandwiching the pot 250 in the lower mold 332.

Numeral 60 is a cavity attraction hole opened like a slit on the inner face of the cavity recess. As shown in the figure, the cavity attraction hole 60 communicates on a rear with an air flow passage formed in a base 500 and the air flow passage communicate with an external air mechanism. Numeral 62 is an attraction hole for air-attracting and supporting the release film 334 on the clamp face of the transfer mold. The attraction hole 62 also communicates with the external air mechanism via the air flow passage formed in the base 500. The release film 334 first is air-attracted on the clamp face of the transfer mold through the attraction hole 62, then air is sucked from the cavity attraction hole 60, whereby the release film 334 is attracted and supported following the inner face of the cavity recess.

The left half of FIG. 5 shows a state in which the release film 334 is attracted to and supported on the inner face of the cavity recess and the molded article 340 is set in the cavity recess. In the embodiment, the upper mold 330 has a clamp face made flat. One release film 334 is supplied to each of the upper mold 330 and the lower mold 332 and covers the transfer mold face of the corresponding mold. In the upper mold 330, the release film 334 is attracted and supported flat through the attraction hole 62 and the cavity attraction hole 60.

The release film 334 used for sealing with a resin in the embodiment needs to have flexibility so as to be attracted and supported easily following the inner face shape of the cavity recess by air suction and needs to resist heating temperatures of the transfer mold. It also needs to be a material that can be easily separated from the transfer mold and easily peeled off with a mold resin after sealing with a resin. Materials having such characteristics are an FEP film, a fluorine—containing glass cloth, a PET film, an ETFE film, polyvinylidene fluoride, etc.

One reason to use the release film 334 for sealing with a resin as described above is to make it possible to seal with a resin without depositing a mold resin directly on the transfer mold faces of the upper mold 330 and the lower mold 332. In the embodiment, for the resin supplied to the pot 250, a lapping resin 54 with a resin sealed with a lapping film is used so as to prevent the resin from being deposited on the inner face of the pot 250.

Figure 8:
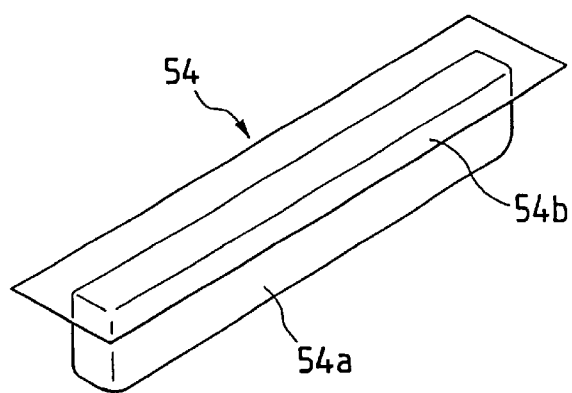
FIG. 8 is a perspective view of a lapping resin.

FIG. 8 shows the outside shape of the lapping resin 54. The lapping resin of the embodiment comprises a resin 54a molded like a stick sealed with a lapping film 54b. The lapping film 54b is extended to sides from the upper end face of the resin 54a and the end face shape becomes T. The extension piece is a portion where two lapping films are bonded and sealed, and is formed so that it can be peeled off by resin pressure at the resin sealing time. As shown in FIG. 5, the lapping resin 54 is set so that the extension piece of the lapping resin 54 is extended to the side of the molded article 340 with the lapping resin 54 supplied to the pot 250 and when the cavity is filled with the resin from the pot 250, the resin is prevented from being deposited on the transfer mold in the resin passage portion.

Figure 6:
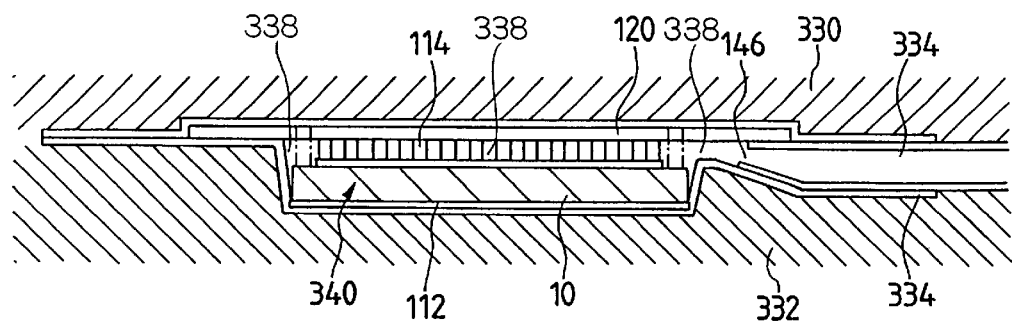
FIG. 6 is a sectional view in a state in which a molded article is clamped by upper and lower molds.

FIG. 6 shows a state in which the molded article 340 is clamped by the upper and lower molds 330 and 332 through the release films 334.

To seal the molded article 340 with a resin, first, release films 334 are sent to the transfer mold face positions of an upper mold 330 and a lower mold 332 and are air-attracted onto the transfer mold faces through attraction holes 62 of the upper mold 330 and the lower mold 332, then air is sucked through cavity attraction holes 60 for forming a cavity recess, then the molded article 340 is aligned with the cavity recess and is set.

Next, the molded article is clamped by the upper mold 330 and the lower mold 332 and the cavity recess 338 is filled with a resin from a pot 250.

FIG. 6 shows a state in which the molded article 340 is set in the transfer mold and clamped by the upper mold 330 and the lower mold 332. It is a sectional view when the cavity recess 338 is viewed from the end face of the leads 114. A large number of leads 114 are placed in parallel and their tips are bent toward the chip face. Numeral 146 is a gate for filling the cavity recess 338 with a resin. As shown in FIG. 4, the gate 146 is connected to the side of a large number of leads 114 placed in parallel and is placed so as to fill the cavity recess 338 with a resin from the side faces of the leads 114. In FIG. 4, the gate 146 is connected to a part of the side margin of the cavity recess 338 for filling the cavity recess 338 with a resin.

However, the side margin of the extension piece of a lapping resin 54 is matched with the side margin of the cavity, whereby the cavity recess 338 can also be filled with a resin from one entire side of the cavity recess 338.

When the molded article 340 is clamped by the upper mold 330 and the lower mold 332 and the cavity recess 338 is filled with a resin, no resin fins must occur on the rear face of the die pad 112 or the external faces of the connection parts 114a of the leads 114. The release film 334 coming in contact with the molded article 340 at the clamping time has the effect of reliably clamping the molded article 340 without damaging the molded article 340 owing to flexibility of the film. Even for a package with leads 114 floating up from the chip face like the CSP, the resin sealing method using the release films can be used to reliably hold the molded article 340.

Since the CSP is sealed with a resin in a state in which the semiconductor chip 10 remains exposed, damage to the semiconductor chip 10 must be prevented. Molding accuracy on the side faces of the package is required and no resin fins must occur on the rear face of the die pad 112 or the external faces of the leads 114. Then, the embodiment is characterized by a mechanism for clamping the molded article 340 from the side face direction in the lower mold 332 for setting the molded article 340 and a press mechanism for pressing the molded article 340 against the cavity recess face of the lower mold 332.

Figure 9A:
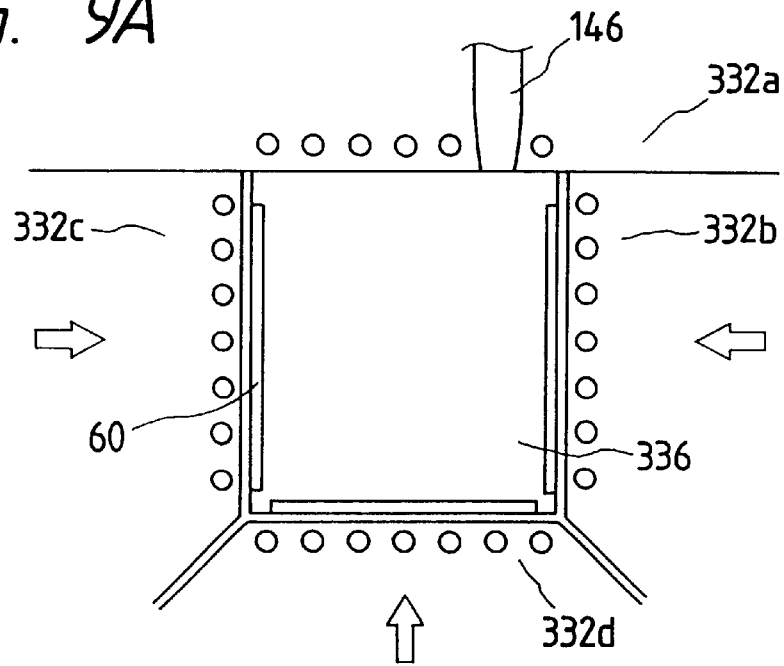
FIGS. 9A and 9B are a plan view and a sectional view to show placement of split molds of the lower mold, respectively.
Figure 9B:
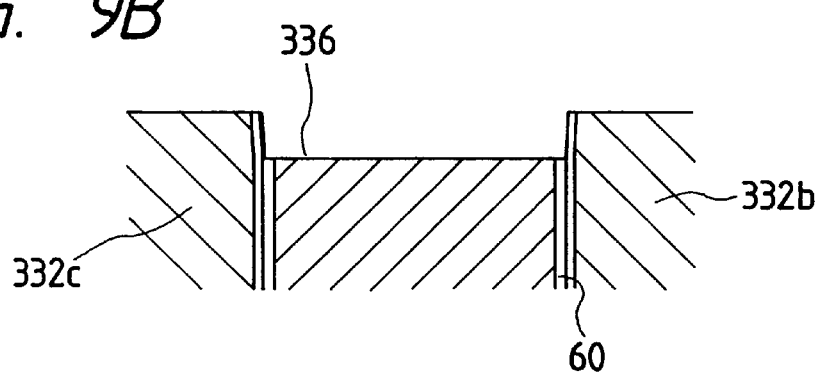

In the embodiment, the lower mold 332 forming a cavity recess 336 is made by split molds having moving molds, as shown in FIGS. 9A and 9B, as the mechanism for clamping the side faces of the moLded article 340. That is, in FIGS. 9A and 9B, numerals 332a, 332b, 332c, and 332d are split molds making up the cavity recess 336; 332a is a fixed mold and 332b, 332c, and 332d are moving molds. When the molded article 340 is set in the lower mold 332, the moving molds 332b, 332c, and 332d are placed at positions slightly wider than the outside dimensions of the semiconductor chip 10. After the molded article 340 is set in the cavity recess 336, the side face of the semiconductor chip 10 is advanced to the clamping position and the molded article 340 is clamped and supported on four side faces. The moving molds 332b, 332c, and 332d are moved by move means using a cam, etc.

The gate 146 is disposed in the fixed mold 332a.

After the molded article 340 is clamped by the upper mold 330 and the lower mold 332, the cavity recess 336 is filled with a resin from the gate 146 for sealing with the resin. When the molded article 340 is set in the lower mold 332, the moving molds 332b, 332c, and 332d are previously moved back, whereby setting the molded article 340 in the cavity recess 336 is facilitated and damage to the semiconductor chip 10 is prevented at the setting time. When the molded article 340 is set, if it is placed slightly out of position, the position difference can also be corrected by clamp operation with the moving molds 332b, 332c, and 332d. The open dimensions of the moving molds 332b, 332c, and 332d may be set appropriately; in the embodiment, the moving mold 332b, 332c, 332d is opened about 0.5 mm as compared with the final clamping position.

Figure 7:
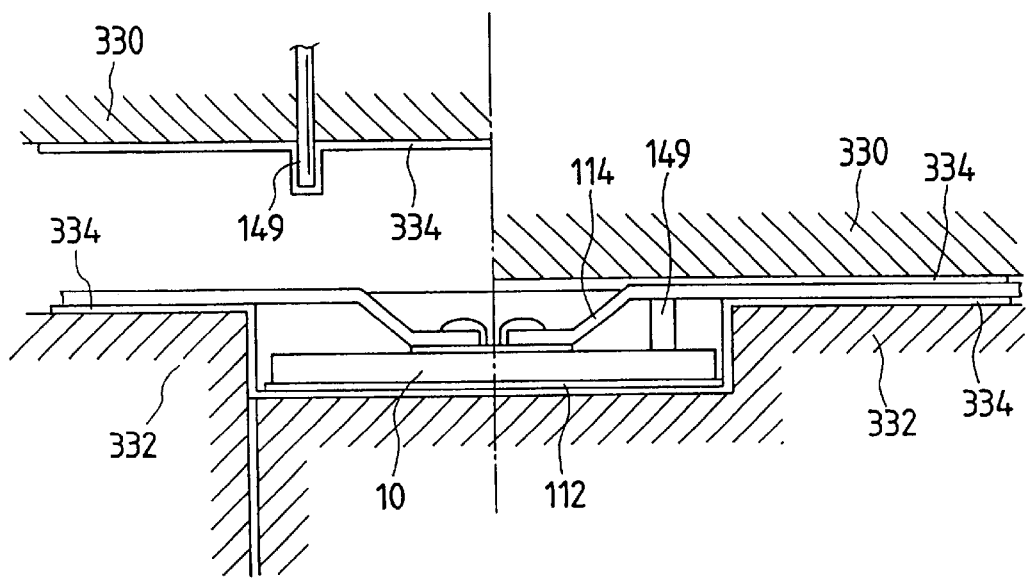
FIG. 7 is an illustration to show how to press the molded article by means of a moving pin disposed in the upper mold.

FIG. 7 shows a structure wherein the upper mold 330 is provided with a moving pin 149 as the press mechanism for pressing the molded article 340 against the cavity recess face of the lower mold 332. It shows a state in which the molded article 340 is set in the lower mold 332 in the left half of the center line and a state in which the molded article 340 is clamped by the upper mold 330 and the lower mold 332 in the right half. When the molded article 340 is clamped, the moving pin 149 comes in contact with the top face of a corner of the semiconductor chip 10 and presses the semiconductor chip 10 as shown in the right half of the center line of FIG. 7. In this state, the cavity recess 336 is filled with a resin.

To press the semiconductor chip 10 by means of the moving pin 149 and fill the cavity recess with a resin, the moving pin 149 is pulled into the upper mold 330 from the cavity at the timing at which the cavity recess is filled with a resin to a degree that the semiconductor chip 10 does not float up, and the whole cavity is filled with the resin finally. The timing at which the moving pin 149 is pulled in may be determined by the resin injecting time or may be sensed by a photoelectric sensor or a pressure sensor placed in the transfer mold. Since the moving pin 149 is covered with the release film 334, the package is sealed with the resin without any trace of the moving pin 149 when the moving pin 149 is pulled in. The release film 334, which is extremely excellent in elasticity, can be easily restored to the same flat face as the cavity recess inner face of the upper mold 330 by pulling in the moving pin 149.

The method of sealing the package with a resin while pressing the molded article 340 against the inner bottom face of the cavity recess 336 by the moving pin 149 is effective as a method of enabling resin molding without allowing a resin to enter the rear face of the semiconductor chip 10, namely, the outer face of the die pad 112. As described above, the die pad 112 is pressed by means of the release film 334 having flexibility in the embodiment. Thus, from this point, a resin is also prevented from entering the rear face of the die pad 112.

The resin sealing system of the embodiment splits the lower mold 332 forming the cavity recess 336 for housing the molded article 340 into split molds, thereby enabling the side faces of the molded article 340 to be clamped reliably, and clamps the molded article 340 via the release films 334 in the thickness direction of the molded article 330, thus can reliably seal the package with a resin without causing resin fins to occur. The outer faces of the connection parts 114a of the leads 114 are covered with the release films 334, whereby the package can be sealed with a resin without causing resin fins to occur on the outer faces of the connection parts 114a.

If a resin sealing method using release films for sealing CSPs with a resin like the resin sealing method of the embodiment is applied, the time required for resin sealing can be shortened and easy mass production of CSPs is enabled as compared with use of the potting method. Since the resin sealing transfer mold is used to seal with a resin, the package molding accuracy can be improved preferably. Void occurrence in the package can be suppressed preferably as compared with the potting method, so that high-reliability CSPs can be provided.

Figure 10:
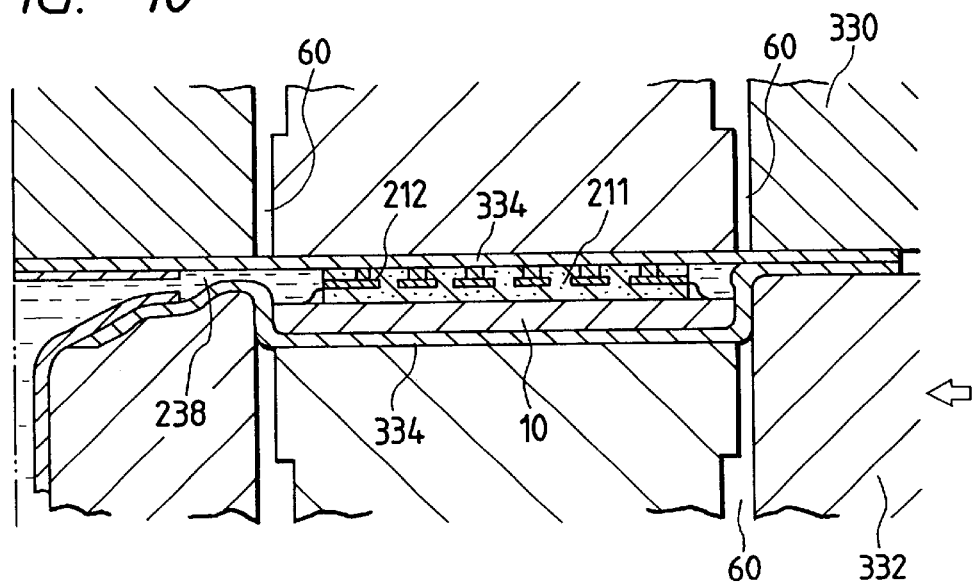
FIG. 10 is a sectional view to show the proximity of a cavity recess in the resin sealing system of CSPs on an enlarged scale.

FIG. 10 shows on an enlarged scale a state in which a CSP including a wiring pattern supported via an electric insulating layer on one side of a semiconductor chip and extended like leads from the periphery of the electric insulating layer and connected to surface electrodes of the semiconductor chip, the connection parts being sealed with a resin, is clamped via the release films 334 by the upper mold 330 and the lower mold 332 and the cavity is filled with resin according to another embodiment of the invention. The CSP includes a wiring pattern 212 provided via an electric insulating layer 211 on the top face of a semiconductor chip 10. Therefore, to seal the CSP with a resin, the release films 334 are air-attracted to and supported on the transfer mold faces of the upper mold 330 and the lower mold 332, then the molded article formed like a single piece is set in the cavity recess of the lower mold 332 and is clamped by the upper mold 330 and the lower mold 332 for sealing with a resin.

The cavity recess made in the lower mold 332 needs to be formed to dimensions to allow the CSP to be just housed with the release film 334 air-attracted on the inner face of the cavity recess and needs to be set to a depth dimension so that the semiconductor chip 10, the electric insulating layer 211, and the wiring pattern 212 are reliably pressed and resin fins do not occur when the molded article is clamped by the upper mold 330 and the lower mold 332.

Since the release films 334 have the effect of elastically pressing the outer face of the molded article 340 when the molded article 340 is clamped by the upper mold 330 and the lower mold 332, the molded article can be reliably clamped without being damaged and can be sealed with a resin without causing any fins to occur.

Figure 1:
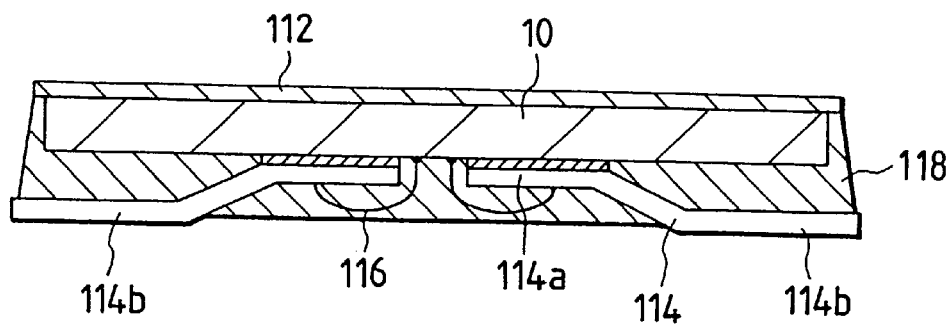
FIG. 1 is a sectional view of a CSP.
Figure 2:
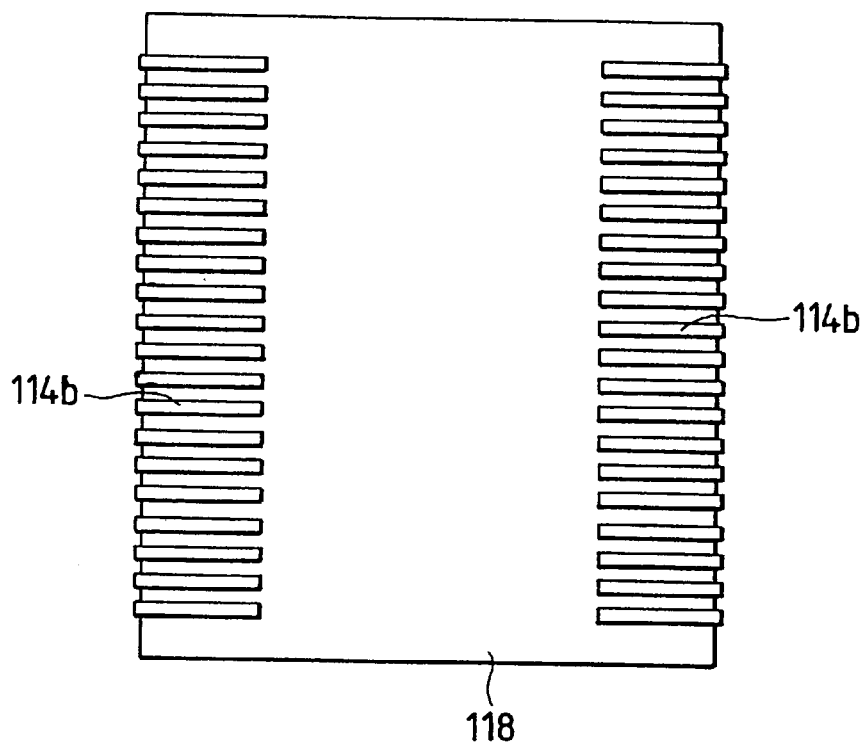
FIG. 2 is a bottom view of the CSP in FIG. 1.
Figure 3A:
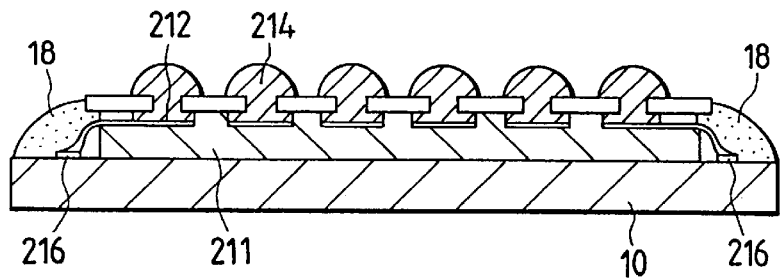
FIGS. 3A to 3D are illustrations to show structures of CSPs.

However, for a CSP where the semiconductor chip 10 is not supported on the ring 120, etc., as shown in FIG. 3A, care must be taken so as not to damage the semiconductor chip 10 at the handling time. Thus, in the embodiment, when the semiconductor chip 10 is set in the cavity recess, the dimensions of the cavity recess are made slightly larger than the outside dimensions of the semiconductor chip 10, and when the package is thereafter sealed with a resin, the cavity recess is set to a predetermined sLze.

Thus, in the system of the embodiment, the lower mold 332 forming the cavity recess is attached movably so that the size of the cavity recess can be changed. When the molded article 340 is set, the cavity recess is set larger than the outside dimensions of the molded article 340 and when the package is sealed with a resin, the lower mold is moved for setting the cavity recess to a predetermined size.

Figure 11A:
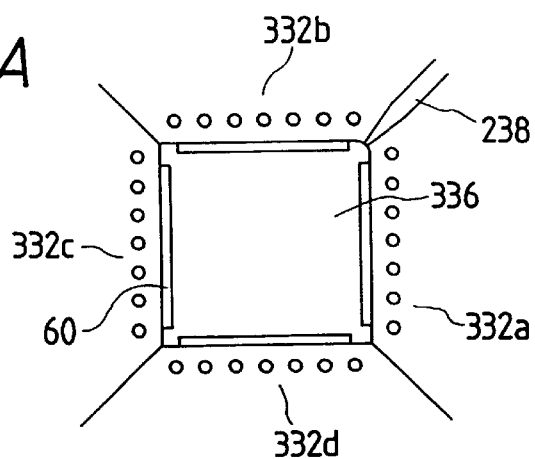
FIGS. 11A and 11B are illustrations to show plane placement of a lower mold.
Figure 11B:
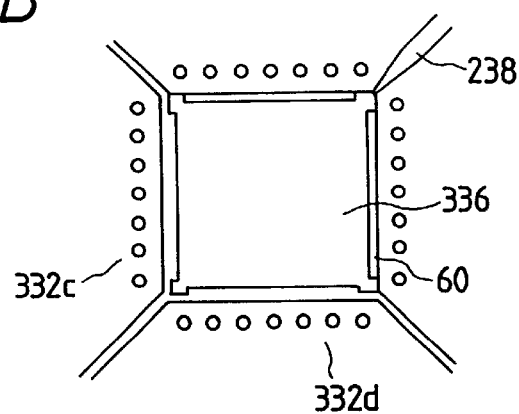

FIGS. 11A and 11B show a plane placement of the lower mold forming the cavity recess 336. In the figures, numerals 332a, 332b, 332c, and 332d are split molds making up four side faces of the cavity recess 336; numerals 332a and 332b are fixed mold parts and numerals 332c and 332d are moving mold parts.

Numeral 238 is a gate for injecting a resin into the cavity. The gate 238 is connected to one corner of the cavity recess and a resin sent from the pot 250 under pressure is injected into the cavity from the corner of the cavity recess.

The fixed mold parts 332a and 332b make up two sides sandwiching the gate 238 and the moving mold parts 332c and 332d make up two sides opposed thereto. FIG. 11B shows a state in which the molded article 340 is set and the moving mold parts 332c and 332d are placed at positions open outward as compared with the positions when the package is sealed with a resin. The open dimensions of the moving mold parts 332c and 332d may be set appropriately; in the embodiment, the moving mold part 332c, 332d is opened about 0.5 mm as compared with the final resin sealing position.

In the embodiment, with the moving mold parts 332c and 332d thus placed at open positions, the release films 334 are attracted to the transfer mold faces and in this state, the molded article 340 is set in the cavity recess 336. The method of supplying the molded article 340 with the cavity recess 336 made larger than the dimensions of the molded article 340 is effective in that the molded article 340 of a single piece can be supplied and that it is not damaged when the molded article 340 is supplied. When the molded article 340 is set, if it is placed slightly out of position, the position difference can be absorbed for setting the molded article.

After the molded article 340 is set in the cavity recess 336, when the package is sealed with a resin, the moving mold parts 332c and 332d are moved to the positions matching the dimensions of the molded article 340 and the side faces of the molded article 340 are reliably held for sealing the package with a resin. FIG. 11A shows a state. in which the moving mold parts 332c and 332d are moved to predetermined positions. The moving mold parts 332c and 332d are moved from the open positions to the regular positions, whereby the molded article 340 is positioned and held. Since the release films 334 have flexibility, the side faces of the molded article 340 are reliably held by means of the moving mold parts 332c and 332d; resin leakage in the side faces is prevented and reliable resin sealing is enabled.

To move the moving mold parts 332c and 332d, they may be slid by move means such as a cam mechanism in association with the opening and closing of the upper mold 10 and the lower mold 332.

In the embodiment, the lower mold portion forming the two sides opposed to the gate 238 are made movable. However, the structure of the lower mold is not necessarily limited to that of the embodiment; any other structure can also be adopted if it makes the plane dimensions of the cavity recess 336 variable.

The method of varying the plane dimensions of the part of the cavity recess 336 in which the molded article 340 is set by means of the moving mold parts 332c and 332d and sealing the package with a resin is also preferably applied to resin sealing of CSPs using the ring 120, the can 222, etc., in addition to the CSP as shown in FIG. 3A.

The resin sealing of the CSP is intended for sealing the wiring pattern 212 surrounding the electric insulating layer 211 provided on the top face of the semiconductor chip 10; no resin must be deposited on the surface of the wiring pattern 212, etc. The resin sealing system of the embodiment clamps the molded article 340 so as to lap the bottom face, the side faces, and the top face of the molded article 340 via the release films 334 and seals the package with a resin, thus can reliably fill only the necessary portion surrounding of the electric insulating layer 211 with the resin. It can perform high-quality resin sealing without causing any resin fins to occur.

Figure 3B:
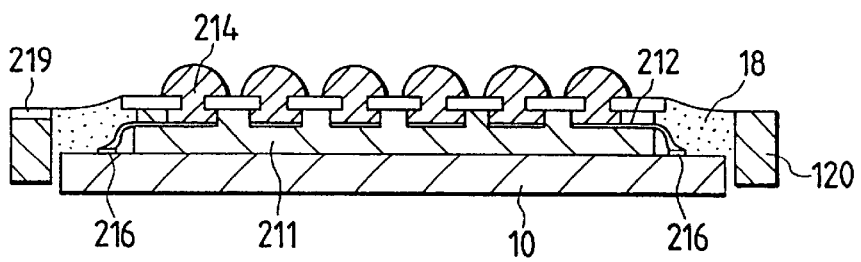
Figure 3C:
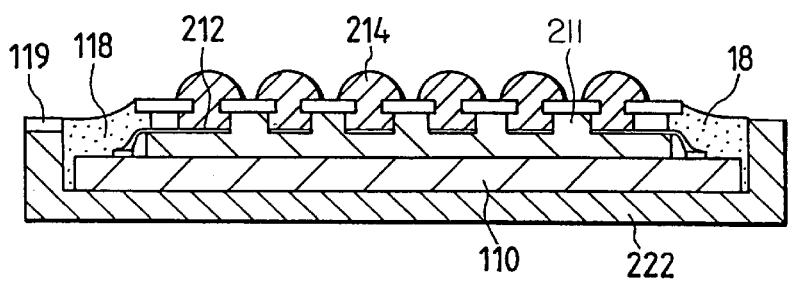
Figure 3D:
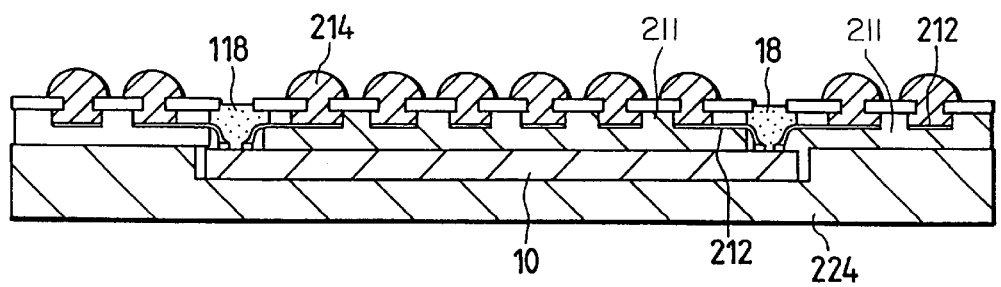

For CSPs using the ring 120 or the can 222, the ring 120 or the can 222 is formed with a gate port 219 or 119, respectively, for making the pot 250 and the cavity recess communicate with each other as shown in FIGS. 3B and 3C, whereby the package can be sealed with a resin in the same manner as the embodiment.

In the above embodiment, a method is applied in which a piece of molded article 340 is set in the mold for resin sealing. As the method of sealing the CSP with a resin other than the above method in which a piece of molded article 340 is set in the mold for resin sealing, there is a method of a plurality of semiconductor chips supported by a carrier tape is set in a mold for resin molding. The method of supporting the semiconductor chips by the carrier tape is excellent in mass productivity.

Figure 12:
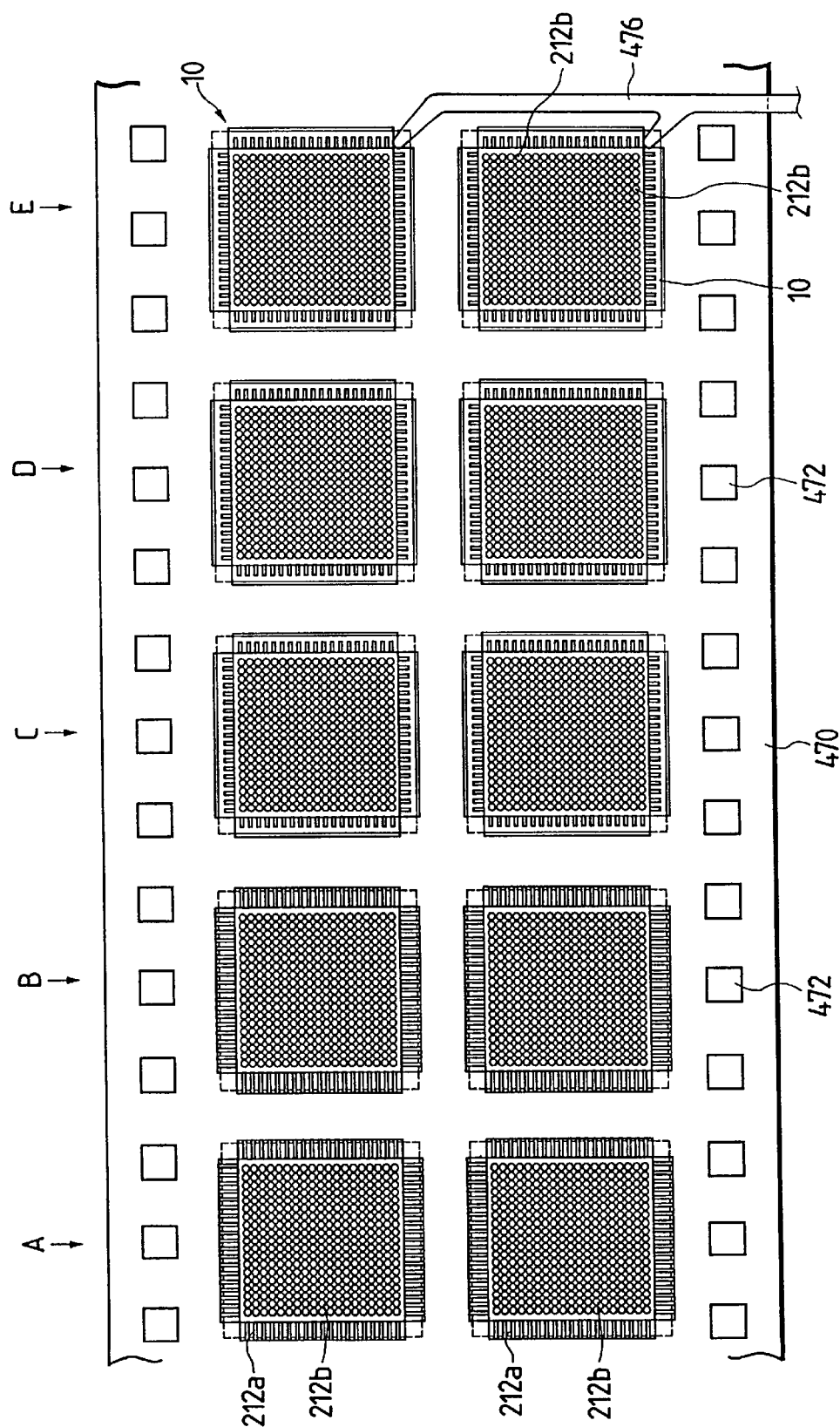
FIG. 12 is a plan view showing a state in which a plurality of semiconductor chips are supported by a carrier tape.

FIG. 12 shows a molded article where a plurality of semiconductor chips 10 are supported by a carrier tape 470. The semiconductor chips 10 are supported two by two widthwise of the carrier tape 470. Reference numeral 472 denotes sprocket holes.

The structure of the respective package portions are identical with that in the above embodiment, and each of the semiconductor chip 10 is supported by the carrier tape 470 on which each wiring pattern 212 is disposed through an elastomer layer that is an electric insulating layer 211 having a buffering property.

FIG. 12 shows a process sequence in which leads 212a of the wiring patterns 212 are bonded onto the surface electrodes 216 and resin-sealed in the order from the left side, for example. Reference numeral 212b denotes lands of the external connection terminals which is joined to solder balls.

A part A of FIG. 12 shows a state where the leads 212a is bridged between the carrier tape 470 and the semiconductor chips 10. A part C thereof shows a state where one end of the leads 114a is cut off, and a part D shows a state where the respective ends of the leads 2112a are bonded to the surface electrodes 116 of the semiconductor chips 10. A part E shows a state where the leads 212a are sealed with a resin.

Figure 13:
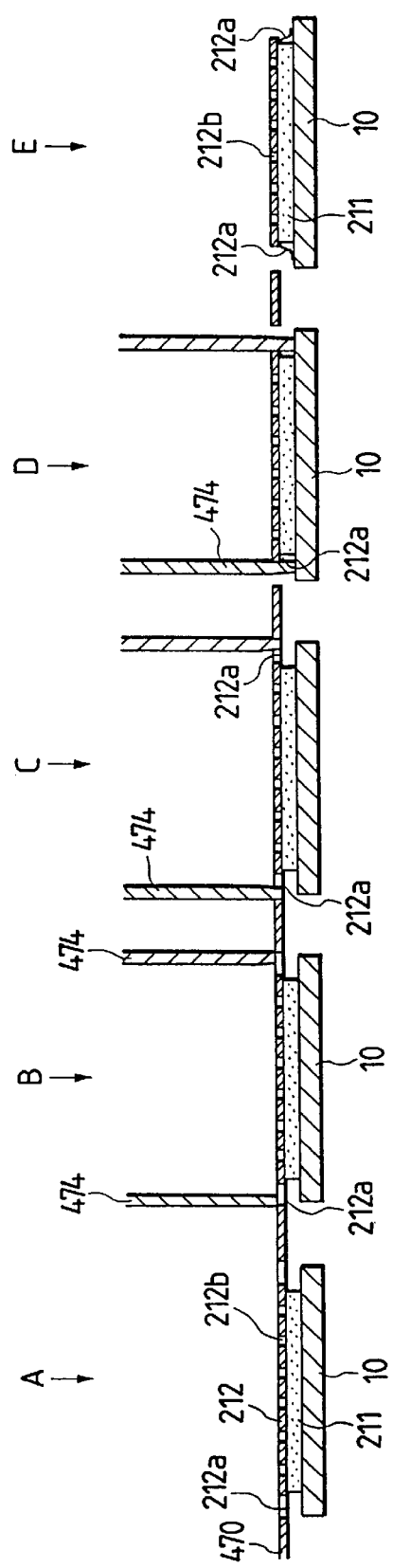
FIG. 13 is a cross-sectional view showing a state in which leads are bonded in a situation where the semiconductor chip is supported by the carrier tape.

FIG. 13 is a cross-sectional view showing processes from an initial process up to a process of bonding the lead 212a to the semiconductor chip 10 supported by the carrier tape 470.

A part A of FIG. 13 shows a state in which the semiconductor chip 10 is made to adhere to the carrier tape 70 through the electric insulating layer 211. The lead 212a bridges a window portion defined in the carrier tape 470 so that the former is supported by the latter. A part B of FIG. 13 shows a state in which a pair of bonding tools 474 are moved down up to a position above the lead 212a for bonding the lead 212a to the surface electrode of the semiconductor chip 10. A part C of FIG. 13 is a state in which each end of the bonding tools 474 abuts against the lead 212a for cutting the lead 212a.

The bonding action of the lead 212a is performed in such a manner that the lead 212a is cut off by a tip of the bonding tool 474, and the lead 212a is sequentially pushed down so that the end of the lead 212a is brought in press contact with the surface electrode for conducting thermo-compression bonding. A part D shows a state in which the lead 212a is bent by the bonding tool 474 and bonded onto the surface electrode of the semiconductor chip 10. A part E shows a state in which the lead 212a is bonded on the surface electrode of the semiconductor chip 10 after removal of the bonding tool 474.

Figure 14:
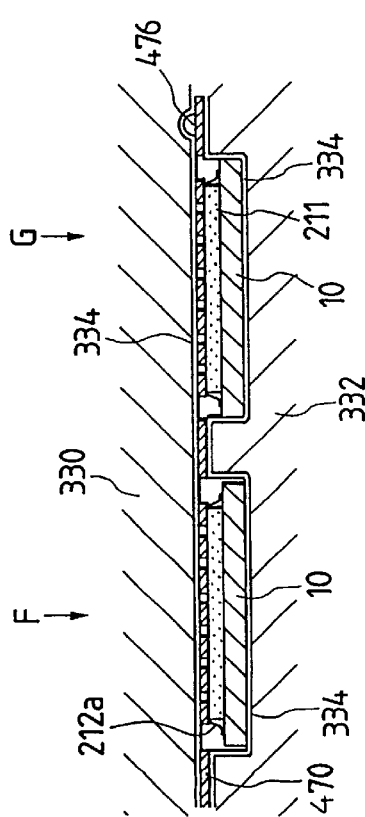
FIG. 14 is a cross-sectional view showing a method of sealing the molded article in which the semiconductor chip is supported by the carrier tape with a resin.

FIG. 14 shows a method of sealing the lead 212a with a resin using a mold after the semiconductor chip 10 is supported on the carrier tape 470 and then bonded on the surface electrode.

In this embodiment, the semiconductor chip 10 is set in the mold together with the carrier tape 470 that supports the semiconductor chip 10, and sealed with a resin. A cavity recess is defined in the mold so as to coincide with a position at which the semiconductor chip 10 is arranged. In clamping the semiconductor chip 10, the respective mold faces of the upper and lower molds 330 and 332 are covered with the release film 334 for resin-sealing as in the above embodiment.

Also, in resin-sealing, movable mold portions are provided in the lower mold 332 so that the cavity recess is made slightly larger than the outer dimensions of the semiconductor chip 10 for facilitating setting of the molded article, and after the molded article is set, the movable mold portions are moved so that the side surfaces of the semiconductor chip 10 are brought in press contact with the inner surfaces of the cavity for resin-sealing, as in the above embodiment. A part F of FIG. 14 is a state in which a slight gap is defined between the surfaces of the semiconductor chip 10 and the inner surface of the cavity recess in a situation where the molded article is set. A part G of FIG. 14 is a state in which the side faces of the semiconductor chip 10 are brought in press contact with the inner surface of the cavity recess by moving the movable mold portions.

Reference numeral 476 denotes a resin path through which the cavity is filled with a resin. In the case where the semiconductor chip 10 is set in the mold while it is supported by the carrier tape 470 as in this embodiment, in pressing the molded article between the upper and lower molds 330 and 332, the carrier tape 470 is sandwiched between the release films 334 on the peripheral portion of the cavity. Therefore, the resin is stuck to the release film as well as the carrier tape 470, and then resin molding is conducted.

Figure 15:
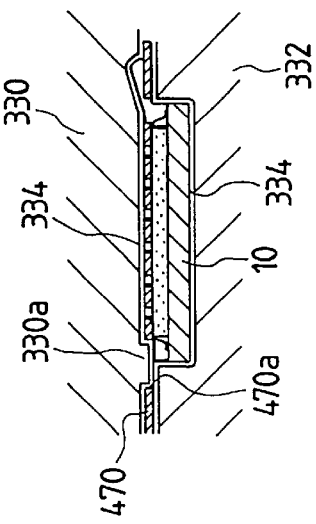
FIG. 15 is a cross-sectional view showing another method of sealing the molded article in which the semiconductor chip is supported by the carrier tape with a resin.

A method of resin-sealing without the resin being stuck to the carrier tape 470 is, for example, shown in FIG. 15. In the figure, a push hole 470a is provided in the carrier tape 470 in correspondence with the peripheral portion of the cavity, and a press protrusion 330a that clamps the press hole 470a is provided on the upper mold 330a, in such a manner that in clamping the molded article, the molded article can be clamped by the press protrusion 330a and the lower mold 332 on the peripheral portion of the cavity. The protruded dimensions of the press protrusion 330a is designed taking the thickness of the carrier tape 470 into account, so that resin fins are prevented from occurring on the outer surface of the product when resin-sealing.

As described above, even in the case where the molded article is set in the mold while the semiconductor chip 10 is supported by the carrier tape 470 for resin-sealing, a proper resin sealing can be performed without generating any resin fins by application of the resin sealing method employing the release film 334.

The resin sealing method using the transfer mold as in the embodiment can shorten the time to hardening of a resin and enables easy mass production of CSPs. According to the resin sealing method using the transfer mold, the molding accuracy of resin molded articles becomes constant and good products with no variations in outside shape can be provided.

The resin sealing method using the transfer mold can suppress occurrence of voids as compared with the potting method; the reliability of CSPs can be improved by making voids small by molding pressure.

In the resin sealing method using the release films 334, the molded article 340 can be sealed with a resin without being clamped. by an excessive force owing to flexibility of the release films 334, so that the molded article 340 can be sealed with a resin without being damaged.

As described above, the resin sealing method and system of CSPs according to the invention can easily provide high-molding-accuracy CSPs with no resin fins and high-reliability CSPs with no voids, etc., enable excellent mass productivity, and cart effectively reduce the CSP manufacturing costs.

Also, the resin sealing system of CSPs according to the invention can perform resin molding without allowing a resin to be put on the joint face of the external connection pins of the package and easily manufacture good CSPs.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A resin sealing device for a chip size package having a semiconductor chip and leads said leads having first ends joined to said semiconductor chip and second ends exposed to an outer face of a sealing resin, said resin sealing device comprising:
   a first mold with a cavity recess for receiving an object to be molded which forms said chip size package;
   a second mold for cooperating with said first mold to clamp said object; and
   release films provided on said first and said second molds,
   wherein said first and said second molds are moveable with respect to each other in a clamping direction, and
   wherein said first mold includes a mold portion that defines at least a part of said cavity recess, and said mold portion is moveable in a lateral direction that is substantially orthogonal to said clamping direction.

2. A resin sealing device as claimed in claim 1, further comprising:
   an attraction hole provided in said second mold, said attraction hole opening to a clamp face of said second mold;
   a cavity attraction hole provided in said first mold, said cavity attraction hole opening to a bottom face of said cavity recess; and
   an air mechanism communicating with said attraction hole and said cavity attraction hole,
   wherein said air mechanism draws air via said attraction hole and said cavity attraction hole to air-attract and support said release films on said first and said second molds.

3. A resin sealing device as claimed in claim 1, wherein said first mold includes a plurality of said mold portions that are respectively moveable in different lateral direction that are substantially orthogonal to said clamping direction.

4. A resin sealing device as claimed in claim 1, further comprising:
   a moving pin provided in said second mold for pressing said object against an inner bottom face of said cavity recess when said cavity recess is filled with said sealing resin.

5. A resin sealing device for a chip size package including a wiring pattern (1) supported via an electric insulating layer on one side of a semiconductor chip, (2) extended from the periphery of said electric insulating layer, and (3) connected to surface electrodes of said semiconductor chip, connections between said wiring pattern and said semiconductor chip being sealed with a resin, said resin sealing device comprising
   a transfer mold with a cavity recess for accommodating said chip size package; and
   a release film provided on said transfer mold and entirely covering said cavity recess,
   wherein said transfer mold is moveable in a clamping direction, and
   wherein said transfer mold includes a mold portion that defines at least a part of said cavity recess, and said mold portion is moveable in a lateral direction that is substantially orthogonal to said clamping direction.

6. A resin sealing device for a chip size package as claimed in claim 5, further comprising:
   a cavity attraction hole opened on an inner bottom face of said cavity recess and
   an air mechanism communicating with said cavity attraction hole,
   wherein said air mechanism draws air via said cavity attraction hole to air-attract and support said release film on said transfer mold.

7. A resin sealing device for a chip size package as claimed in claim 5, wherein said transfer mold includes a plurality of said mold portions that are respectively moveable in different lateral direction that are substantially orthogonal to said clamping direction.

8. A resin sealing device for a chip size package as claimed in claim 5, further comprising a moving pin for pressing said semiconductor chip against an inner bottom face of said cavity recess.

9. A resin sealing device adapted for molding an article having a wiring pattern supported on a formation face of surface electrodes of a semiconductor chip via an electric insulating layer, said resin sealing device comprising:
   an upper mold part;
   a lower mold part with a cavity recess for receiving said article; and
   an attraction and support mechanism which attracts and supports a release film on a mold face containing said cavity recess,
   wherein said upper mold part and said lower mold part are moveable in a clamping direction to clamp said article in said cavity recess,
   wherein said lower mold part includes a mold portion that defines at least a part of said cavity recess, and said mold portion is moveable in a lateral direction that is substantially orthogonal to said clamping direction.

10. The resin sealing device as claimed in claim 9:
    wherein said attraction and support mechanism comprises an attraction hole opened on a parting face of said upper mold part, a cavity attraction hole opened on an inner bottom of said cavity recess, and an air mechanism communicating with said attraction hole and said cavity attraction hole.

11. The resin sealing device as claimed in claim 10, further comprising:
    move means for moving said mold portion laterally to press a side of said article by an inner face of said cavity recess via said release film after said article is set in said cavity recess,
    wherein, when said article is set in said lower mold part, a plane area of said cavity recess is set larger than outer dimensions of said article.

12. The resin sealing device as claimed in claim 9, further comprising:
    move means for moving said mold portion laterally to press a side of said article by an inner face of said cavity recess via said release film after said article is set in said cavity recess,
    wherein, when said article is set in said lower mold part, a plane area of said cavity recess is larger than outer dimensions of said article.

13. A resin sealing device of a semiconductor device wherein leads electrically connected to electrodes of a semiconductor chip are exposed along an outer face of seal resin for sealing the semiconductor chip so that said leads are mountable on a surface, said device comprising:

a mold formed with a cavity recess for receiving an article with said leads joined to said semiconductor chip; and an attraction and support mechanism which attracts and supports a release film on a mold face of said mold containing said cavity recess by air attraction, wherein said mold is moveable in a clamping direction, said mold includes a mold portion that defines at least a part of said cavity recess, and said mold portion is moveable in a lateral direction that is substantially orthogonal to said clamping direction.

14. The resin sealing device as claimed in claim 13, wherein said attraction and support mechanism comprises:

a cavity attraction hole opened in an inner bottom of said cavity recess; and an air mechanism communicating with said cavity attraction hole.

15. The resin sealing device as claimed in claim 14 wherein a plane area of said cavity recess is adjustable via move means for moving said mold portion laterally.

16. The resin sealing device as claimed in claim 15, further comprising:

a movable pin for pressing said semiconductor chip of said article against a bottom of said cavity recess when said cavity recess is filled with said seal resin.

17. The resin sealing device as claimed in claim 14, further comprising:

a movable pin for pressing said semiconductor chip of said article against a bottom of said cavity recess when said cavity recess is filled with said seal resin.

18. The resin sealing device as claimed in claim 13, further comprising:

move means for laterally moving said mold portion to adjust a plane area of said cavity recess.

19. The resin sealing device as claimed in claim 18, further comprising:

a movable pin for pressing said semiconductor chip of said article against a bottom of said cavity recess when said cavity recess is filled with said seal resin.

20. The resin sealing device as claimed in claim 13, further comprising:

a movable pin for pressing said semiconductor chip of said article against a bottom of said cavity recess when said cavity recess is filled with said seal resin.

* * * * *